United States Patent [19]
Cadwell, Jr. et al.

[11] Patent Number: 5,276,938
[45] Date of Patent: Jan. 11, 1994

[54] FREON RECOVERY WORKSTATION

[75] Inventors: G. Mason Cadwell, Jr., Kennett Square; Glenn S. Holmes, Norristown, both of Pa.

[73] Assignee: United States Environmental Services, Inc., Norristown, Pa.

[21] Appl. No.: 999,218

[22] Filed: Dec. 30, 1992

[51] Int. Cl.⁵ .................................... A47L 5/38
[52] U.S. Cl. .......................... 15/302; 15/301; 15/310; 15/321
[58] Field of Search ............ 15/320, 302, 310, 301, 15/321

[56] References Cited

U.S. PATENT DOCUMENTS

| | | | |
|---|---|---|---|
| 2,574,731 | 11/1951 | Dapprich | 15/320 X |
| 2,694,914 | 11/1954 | Glover | 15/310 X |
| 3,775,053 | 11/1973 | Wisdom | 15/302 X |
| 4,322,252 | 3/1982 | Plumb | 15/302 X |
| 4,826,539 | 5/1989 | Harpold | 15/302 X |
| 4,947,510 | 8/1990 | English | 15/310 |

*Primary Examiner*—Chris K. Moore
*Attorney, Agent, or Firm*—Ezra Sutton

[57] ABSTRACT

A freon recovery workstation including a collection tray for collecting and recovering liquid freon from the work area, forced air passageways disposed above and below the work area for drawing and receiving freon vapor, a freon-adsorbing unit connected to the forced air passageways for adsorbing and recovering the freon vapor, and a freon applicator in the form of a hand tool for aiming and regulating the use of freon.

18 Claims, 4 Drawing Sheets

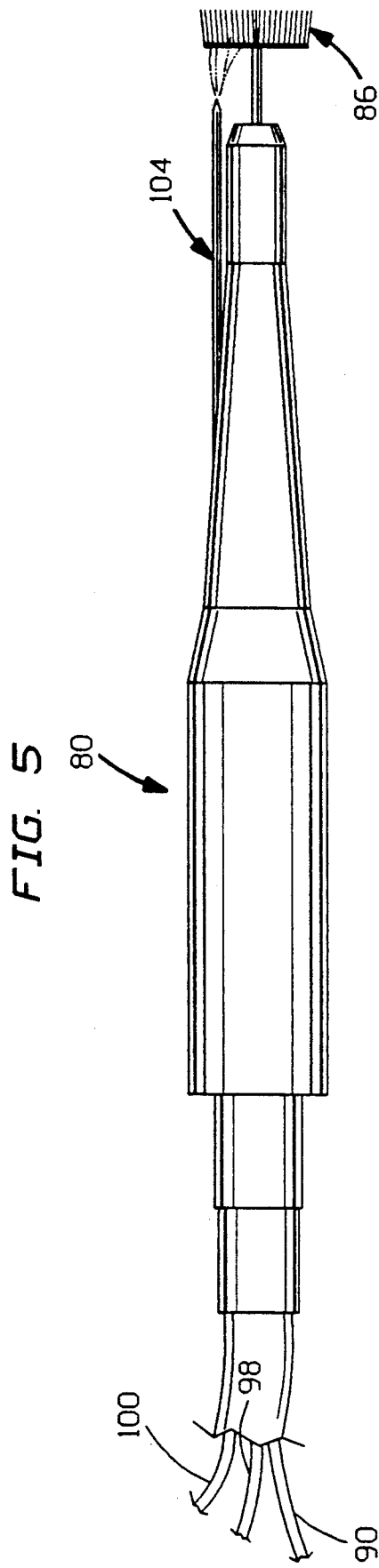

FREON RECOVERY WORKSTATION

FIELD OF THE INVENTION

The present invention relates to a workstation for recovering freon or other solvents used in cleaning circuit boards and other workpieces.

BACKGROUND OF THE INVENTION

Freon-113 is one of the solvents used to brush away the silicone coating on printed circuit boards being cleaned and repaired. Extreme care must be taken in working with Freon-113, since it is toxic to the worker, harmful to the ozone layer, it evaporates quickly, it is expensive, and is irreplaceable.

Thus, it is desirable to recover as much as possible of the Freon-113 which is used. In the past, paraffin wax has been used to recover the freon by absorbing it. However, paraffin has a slow rate of absorption due to its small surface area and does not recover all of the freon. In addition, carbon filters and coal have been used to recover the freon by adsorbing it. Still further, ion exchange resins have been used to recover the freon. However, no system has been developed to recover a large percentage of or substantially all of the freon or other solvents used for cleaning and repairing workpieces.

In addition, when the freon or solvent is applied, a lot is wasted. Typically, a paint brush is used to apply the solvent to small areas of the circuit boards or workpieces. However, this procedure is wasteful and inefficient. In addition, when workers use this procedure, because of the repetitive wrist movement used in cleaning, they have a tendency to develop carpal tunnel injury syndrome.

Accordingly, it is an object of the present invention to provide a recovery workstation that substantially reduces the amount of freon or other solvent used and recaptures substantially all of it, in addition to increasing production by at least 50%.

It is a further object of the present invention to provide a freon recovery workstation, which prevents toxic harm to the workers in the workplace and which prevents harm to the ozone layer, in addition to providing an efficient and economical system in which substantially all of the expensive freon is recovered for reuse.

It is a still further object of the present invention to recover the freon or other solvent even after it has evaporated and becomes a vapor, so that harmful vapors are eliminated from the workplace and the atmosphere.

It is also an object of the present invention to provide a hand tool for economically and efficiently applying the freon or other solvent to the workpiece being cleaned by precisely aiming it and regulating its usage and which reduces the tendency of workers to develop carpal tunnel injury syndrome.

SUMMARY OF THE INVENTION

In accordance with the principles of the present invention, there is provided a freon recovery workstation for cleaning printed circuit boards or other workpieces with freon which includes a screen for receiving freon after it is used to clean the printed circuit boards and for filtering out any debris in the freon, and a liquid collection sink or tray disposed below the screen for receiving and collecting the freon which has passed through the screen. A freon storage container is connected to the liquid collection tray for receiving and collecting the liquid freon which is collected in the liquid collection tray. Further, in order to recover the freon vapor from the workstation, ducts are disposed above and below the screen. A freon-absorbing unit is connected to the ducts for absorbing the freon vapor. A blower motor is provided for drawing the freon vapor from the work area through the ducts and through the freon-absorbing unit to absorb the freon vapor for recovery and reuse.

In addition, a freon applicator in the form of a low rpm, high torque, hand tool is provided having detachable cleaning brushes connected to it, as will be explained.

BRIEF DESCRIPTION OF THE DRAWINGS

Further objects, features, and advantages of the present invention will become apparent upon consideration of the detailed description of the presently-preferred embodiment, when taken in conjunction with the accompanying drawings wherein:

FIG. 5 is a detailed view of the hand tool.

DETAILED DESCRIPTION OF THE PREFERRED EMBODIMENT

Figure 1:
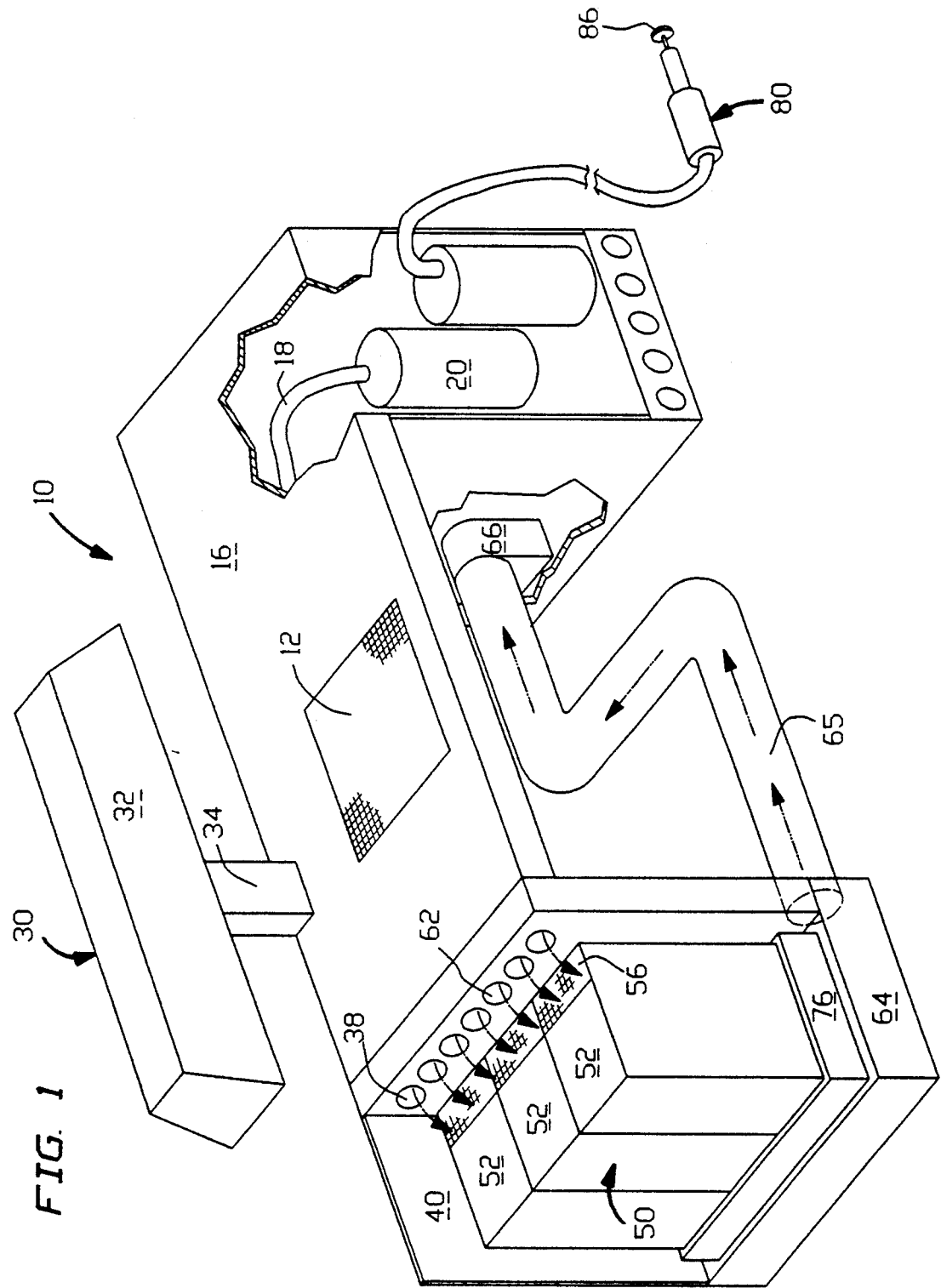
FIG. 1 is a diagrammatic view of the overall freon recovery workstation.
Figure 2:
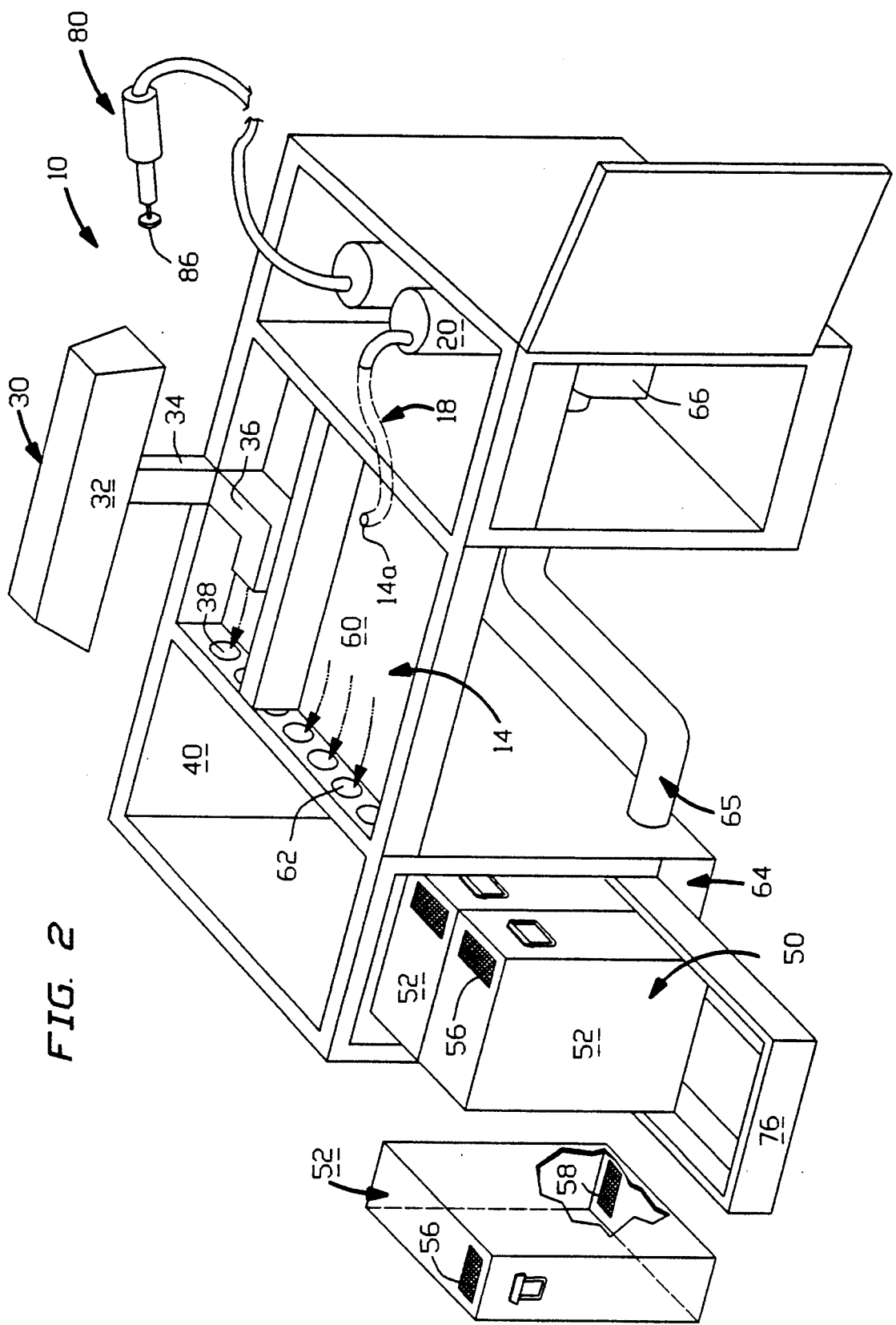
FIG. 2 is a perspective view of the workstation.

Referring to FIG. 1, there is shown a recovery workstation 10 embodying the principles of the present invention. Workstation 10 includes a stainless steel screen 12, having a size of approximately 18" by 18". Typically, the worker places the circuit boards or workpieces on screen 12 for cleaning and repairs, and therefore, screen 12 must be of sufficient stiffness to allow the worker to press down on the screen with the circuit boards without damaging the screen 12. Screen 12 is placed slightly below the surrounding tabletop surface 16 to prevent runoff of the liquid freon, and screen 12 also functions to filter out any debris in the used freon.

The tabletop 16 surrounding screen 12 is sloped toward the screen, so that the spilled liquid freon overcomes the surface tension by gravity and will cause the liquid freon to drain into screen 12. The surrounding tabletop 16 is coated with a freon-resistant material, such as a two-part epoxy coating. To make it conductive, aluminum or graphite is mixed into the epoxy. In the preferred embodiment, the tabletop is at a height which allows the worker to stand or sit.

A liquid collection sink or tray 14, formed of stainless steel, is disposed under the screen 12 for receiving and collecting the liquid freon which has passed through screen 12. Tray 14 has a drain hole 14a at its lowest point, which is connected by a tube 18 to a freon-collecting storage container 20. In this manner, the liquid freon collected in tray 14 is transferred to freon container 20, so that it is completely recovered and may be reused.

Since Freon-113 has a tendency to vaporize quickly, freon vapor is also produced during the cleaning process, and it must be recovered in addition to the liquid freon. To accomplish this, ducts or passageways are provided above and below the work area (at screen 12) to recover the freon vapor.

As shown in the drawings, an overhead venting unit 30 is provided, which includes a receiving duct 32 and a vertical duct 34 connected to a horizontal duct 36 behind tray 14. Horizontal duct 36 is in communication with openings 38 connected to a compartment 40 which houses the freon-adsorbing unit 50, to be explained. In this manner, freon vapor drawn into overhead venting unit 30 is guided through the passageways formed in ducts 32, 34, and 36 to freon-adsorbing unit 50 for recovery of the freon vapor.

As also shown in the drawings, a second arrangement is provided for recovering the freon vapor from the work area. The interior of tray 14 forms a duct or passageway 60 below screen 12 for receiving the freon vapor. The sidewall of tray 14 has openings 62 to allow the freon vapor collected in duct 60 to be guided to compartment 40 which houses the freon-adsorbing unit 50 for recovery of the freon vapor.

In this manner, all freon vapor given off during the cleaning process is guided from above and below the work area to freon-adsorbing unit 50. Below unit 50 is a manifold 64 connected to a duct 65 and a blower motor 66 which produces a draw to pull the freon vapor from the work area through the passageways formed by ducts 32, 34, 36, and 60 and through freon-adsorbing unit 50, which operates in a manner to be explained. In this manner, the invention prevents emission of Freon-113 vapor, or other solvent vapor, into the breathing air of the worker and into the surrounding atmosphere.

The freon-adsorbing unit 50 includes a plurality of carbon canisters 52 which each contain carbon pellets 54 for adsorbing the freon vapor. In order to operate for 22 working days per month, the freon-adsorbing unit 50 is provided with about 180 pounds of the carbon pellets 54.

Figure 3:
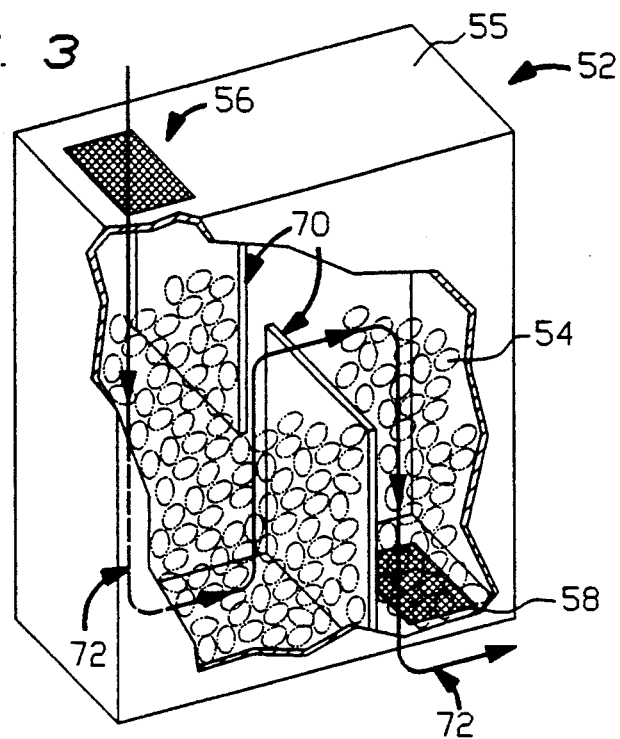
FIG. 3 is a perspective view of the freon-adsorbing unit.

As shown in FIG. 3, each carbon canister 52 is provided with a removable cover 55, an opening 56 in cover 55, an opening 58 at the bottom, and baffles 70 that form a long air passageway, as represented by arrows 72, through the canister. In this manner, the freon vapor passing through unit 50 and carbon canisters 52 remains for a sufficiently long time to be completely adsorbed by carbon pellets 54, before the drawing air exits into manifold 64 below adsorbing unit 50.

The carbon canisters 52 are disposed in a sliding drawer 76 and are removable, so that they can be heated in an oven to recover the used freon. The freon vapor condenses in a condenser and is collected and recovered in a freon storage container for reuse. The freon container is equipped to prevent the freon from revaporizing, and it is also provided with quick connecting devices to allow for easy collection and processing for reuse.

Although adsorbing unit 50 is shown containing carbon, other materials are usable, such as paraffin wax and ion exchange resins. In addition, although the present invention describes the use of freon as the cleaning solvent, it should be understood that other solvents may be employed. For example, other usable solvents are toulene, xylene, or isopropyl alcohol.

Figure 4:
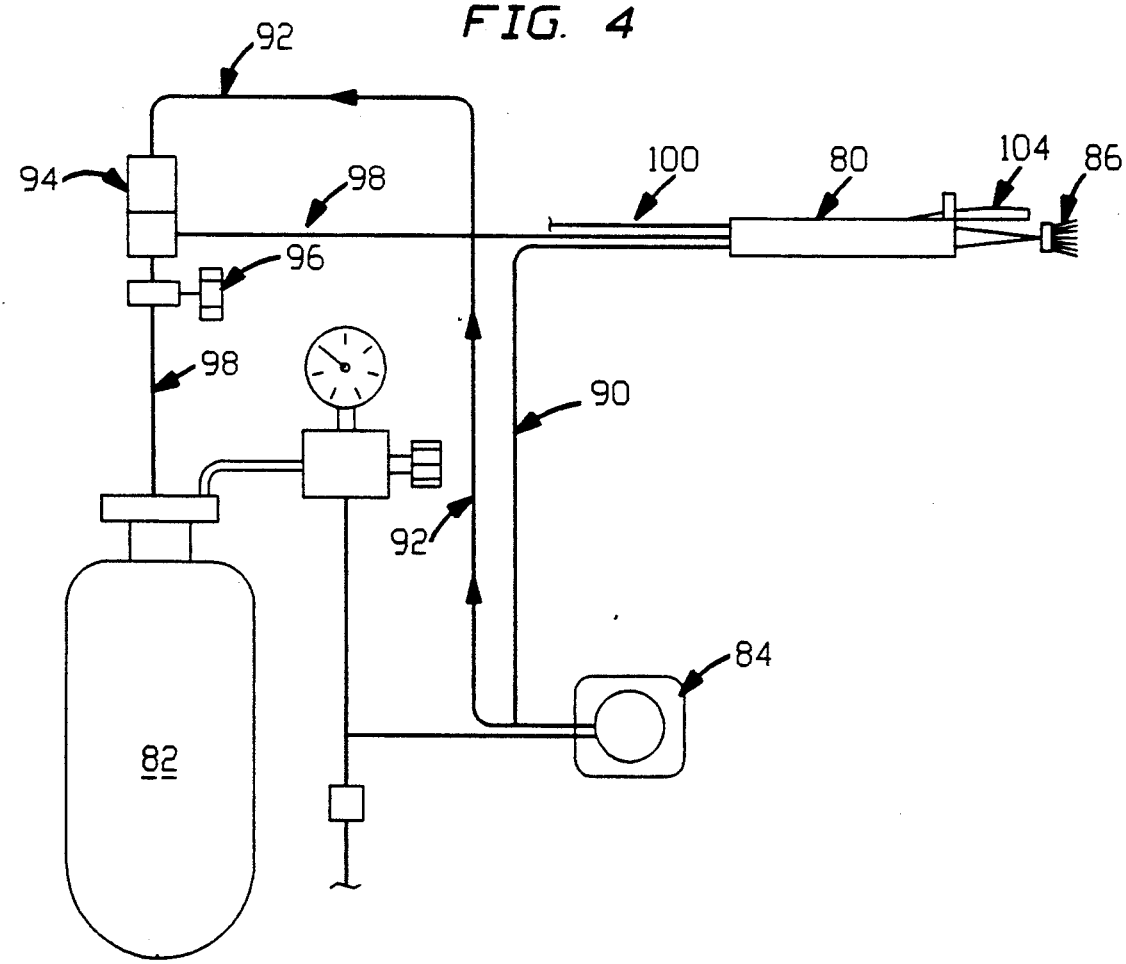
FIG. 4 is a diagram of the hand tool and its controls.

As shown in FIG. 4, a hand tool 80 is provided to apply the liquid freon or other solvent to clean the printed circuit boards or other workpieces. The hand tool 80 is a rotary cleaner, which is used to apply the Freon-113 or other solvent to remove the silicone covering the circuit boards. The hand tool 80 is connected to a pressurized tank 82 containing the freon for supplying it to the hand tool, and it is controlled by a floor pedal 84 attached to the workstation. In addition, the hand tool 80 is equipped with detachable brushes 86. Brushes 86 may be of different sizes and shapes to accommodate the different workpieces. Preferably, a low rpm, high torque hand tool 80 is used for the mechanical brushing and freon application. In the preferred embodiment, the hand tool 80 rotates at up to 500 rpm and may accommodate different brush attachments 86. To resist the freon, the hand tool is provided with Teflon fittings and may be powered by pneumatic or electric power.

As shown in FIG. 4, foot pedal 84 is connected to air line 90 for driving the hand tool and air line 92 for controlling the supply of freon from tank 82 through air-operated valve 94. A volume control 96 is also provided to regulate the supply of freon in line 98, which supplies the freon from tank 82 to the hand tool. A line 100 is provided to exhaust air from the hand tool. As shown in FIG. 5, hand tool 80 is provided with a freon applicator in the form of supply tube 104 connected to freon supply line 98. Tube 104 supplies freon to the cleaning brush 86 or directly to the workpiece being cleaned.

In this manner, hand tool 80 provides a precise device for regulating and aiming the freon or other solvent at the workpiece, which is required while brushing away the silicone coating in the case of circuit boards. Since tube 104 of the hand tool 80 can be precisely aimed, and since the amount of freon used can be precisely regulated, the hand tool 80 substantially reduces the amount of freon used by the worker. In addition, hand tool 80 provides the additional advantage of helping to reduce carpal tunnel injury by reducing or substantially eliminating the repetitive hand motion of brushing, which causes this injury to the wrist. The worker, by operating the foot pedal 84, supplies freon to the brush attachment 86 of the hand tool as it is needed and thus provides a precise method of using, regulating, and aiming the freon.

Advantageously, as a result of the present invention, substantially all of the freon used is recovered for reuse. In addition, toxic freon is eliminated from the workplace and the environment and prevents damage to the ozone layer. Further, use of the hand tool reduces the tendency of workers to acquire carpal tunnel injury and substantially reduces the amount of freon or other solvent used.

A latitude of modification, change, and substitution is intended in the foregoing disclosure, and in some instances, some features of the invention will be employed without a corresponding use of other features. Accordingly, it is appropriate that the appended claims be construed broadly and in a manner consistent with the spirit and scope of the invention herein.

What is claimed is:

1. A freon recovery workstation for cleaning and repairing printed circuit boards with freon, comprising:
    a) a work area including a screen for receiving liquid freon after the freon is used to clean the printed circuit boards and for filtering out any debris in said freon;
    b) a liquid collection tray disposed below said screen for receiving and collecting the liquid freon which has passed through said screen;
    c) a freon storage container connected to said liquid collection tray for receiving and collecting the liquid freon which is collected in said liquid collection tray;

d) a first passageway for receiving freon vapor from the work area above said screen;

e) a second passageway formed in said liquid collection tray for receiving freon vapor from said work area;

f) freon-collection means connected to said first and second passageways for collecting said freon vapor; and g) means for drawing said freon vapor from said work area through said first and second passageways and to said freon-collection means to collect said freon vapor for recovery and reuse.

2. A freon recovery workstation in accordance with claim 1, wherein the work surface surrounding said screen is disposed at an angle to allow gravity to move said liquid freon to said screen.

3. A freon recovery workstation in accordance with claim 1, wherein said freon-collection means includes a plurality of removable canisters containing carbon pellets for adsorbing said freon vapor.

4. A freon recovery workstation in accordance with claim 3, wherein said canisters are disposed in a sliding drawer for removing said canisters from said workstation and wherein said canisters include baffles for lengthening the flow path of said freon vapor through said canisters.

5. A freon recovery workstation in accordance with claim 4, wherein said means for drawing including an air passageway below said canisters and a blower connected to said air passageway for drawing said freon vapor through said canisters.

6. A freon recovery workstation in accordance with claim 1, wherein said means for drawing said freon vapor includes a blower motor.

7. A freon recovery workstation in accordance with claim 1, further including a freon applicator in the form of a hand tool having a cleaning brush detachably connected thereto.

8. A freon recovery workstation in accordance with claim 7, wherein said hand tool is connected to a supply tank of pressurized freon and wherein said hand tool is operated by a foot pedal.

9. A freon recovery workstation in accordance with claim 8, wherein said hand tool includes a tube for supplying said freon to said cleaning brush or directly to the printed circuit boards being cleaned.

10. A solvent recovery workstation for cleaning a workpiece with a solvent, comprising:

a) a work area including a screen for receiving liquid solvent after the solvent is used to clean the workpiece and for filtering out any debris in said solvent;

b) a liquid collection tray disposed below said screen for receiving and collecting the liquid solvent which has passed through said screen;

c) a solvent storage container connected to said liquid collection tray for receiving and collecting the liquid solvent which is collected in said liquid collection tray;

d) a first passageway for receiving solvent vapor from the work area above said screen;

e) a second passageway formed in said liquid collection tray for receiving solvent vapor from said work area;

f) solvent-collecting means connected to said first and second passageways for collecting said solvent vapor; and g) means for drawing said solvent vapor from said work area through said first and second passageways and to said solvent-collection means to collect said solvent vapor for recovery and reuse.

11. A solvent recovery workstation in accordance with claim 10, wherein the work surface surrounding said screen is disposed at an angle to allow gravity to move said liquid solvent to said screen.

12. A solvent recovery workstation in accordance with claim 10, wherein said solvent-collection means includes a plurality of removable canisters containing carbon pellets for adsorbing said solvent vapor.

13. A solvent recovery workstation in accordance with claim 12, wherein said canisters are disposed in a sliding drawer for removing said canisters from said workstation and wherein said canisters include baffles for lengthening the flow path of said solvent vapor through said canisters.

14. A solvent recovery work station in accordance with claim 13, wherein said means for drawing including an air passageway below said canisters and a blower connected to said air passageway for drawing said solvent vapor through said canisters.

15. A solvent recovery workstation in accordance with claim 10, wherein said means for drawing said solvent vapor includes a blower motor.

16. A solvent recovery workstation in accordance with claim 10, further including a solvent applicator in the form of a hand tool having a cleaning brush detachably connected thereto.

17. A solvent recovery workstation in accordance with claim 16, wherein said hand tool is connected to a supply tank of pressurized solvent and wherein said hand tool is operated by a foot pedal.

18. A solvent recovery workstation in accordance with claim 17, wherein said hand tool includes a tube for supplying said solvent to said cleaning brush or directly to the workpiece being cleaned.

* * * * *